(12) United States Patent
Ulrich et al.

(10) Patent No.: US 6,347,025 B1
(45) Date of Patent: Feb. 12, 2002

(54) GROUND FAULT PROTECTION METHOD AND APPARATUS

(75) Inventors: Mark A. Ulrich, New London; Jeffery J. Gadamus, Hortonville, both of WI (US)

(73) Assignee: Illinois Tool Works Inc., Glenview, IL (US)

( * ) Notice: Subject to any disclaimer, the term of this patent is extended or adjusted under 35 U.S.C. 154(b) by 0 days.

(21) Appl. No.: 09/488,767

(22) Filed: Jan. 21, 2000

(51) Int. Cl.$^7$ ................................................ H02H 3/16
(52) U.S. Cl. ......................................................... 361/42
(58) Field of Search ............................... 361/42, 43, 44, 361/45, 46, 47

(56) References Cited

U.S. PATENT DOCUMENTS

| | | |
|---|---|---|
| 4,001,646 A | 1/1977 | Howell |
| 4,206,398 A | 6/1980 | Janning |
| 4,378,579 A | 3/1983 | Hudson, Jr. |
| 4,712,151 A | 12/1987 | Dvorak |
| 4,809,123 A | 2/1989 | Allington et al. |

*Primary Examiner*—Edward H. Tso
(74) *Attorney, Agent, or Firm*—Joseph W. Byrne

(57) ABSTRACT

A method and apparatus for supply welding, plasma cutting, and/or induction heating power having a ground fault interrupt (GFI) protection circuit is disclosed. The primary winding of a monitoring transformer in the GFI protection circuit is connected between the high frequency floating output of the power supply and ground. One end of the secondary of the monitoring transformer is connected to a voltage source. The other end of the secondary is connected to an impedance. The other end of the impedance is connected back to the voltage source to form a voltage divider across the voltage source. Changes in the impedance between the floating output of the power supply and ground are sensed by the GFI protection circuit and converted into a voltage. This voltage is filtered, rectified, and calibrated into a dc sense signal. The sense signal is compared to a threshold signal. In the event the sense signal exceeds the threshold signal, an interrupt signal is sent to the power supply and the power supply shuts down.

28 Claims, 13 Drawing Sheets

US 6,347,025 B1

GROUND FAULT PROTECTION METHOD AND APPARATUS

FIELD OF THE INVENTION

The present invention relates generally to an apparatus and method for detecting a ground fault. More specifically, it relates to an apparatus and method for detecting a ground fault while providing welding, plasma cutting, and/or induction heating power.

BACKGROUND OF THE INVENTION

Welding, plasma cutting, and induction heating power supplies are well known. Typically, such power supplies do not have a ground fault interrupt circuit, but rather include reduced open circuit output voltages, low current, high frequency starting circuits, and cautionary labels. However, it is difficult to provide a reduced output voltage for induction heating.

Ground fault interrupting circuits are known outside the welding, plasma cutting, and induction heating industry, but using known ground fault interrupting circuits in the welding, plasma cutting, and induction heating industry is difficult because of the nature of the power supplies and the environments in which they are used.

FIG. 11 shows a common type of prior art ground fault protection circuit used in various locations, including homes. In this circuit, two floating leads 800 & 801 of the power supply pass through the center of a current transformer 802. The secondary winding of current transformer 802 is typically connected to a relay driver circuit 803. The relay 804 in turn is connected to shut down the power supply in the event of a ground fault.

When no ground fault (e.g. no unintended current path) is present, all of the current flowing through first lead 800 (e.g. power lead) returns through second lead 801 (e.g. return lead) and the total net current flowing through current transformer 802 is zero. No voltage is established in the secondary winding of current transformer 802 during normal operation and relay 804 is not tripped. However, if a ground fault is present (an alternative current path develops for the current flowing out of the power supply to ground), at least some of the current flowing in power lead 800 will flow through the fault path to ground. The net current flowing through current transformer 802 is therefore no longer zero since a portion of the return current is escaping to ground. Thus a signal is established in the secondary of current transformer 802. If enough current is diverted to ground through the ground fault, the signal in the secondary will drive relay 804 to trip thereby shutting down the power supply.

This type of ground fault protection device is sensitive, but susceptible to high frequency noise. The problem is exacerbated when the load is inductive, such as a welder, plasma cutter, or an induction heater. This type of device is intended for use with 50–60 Hz line voltages typically found in the home and power supplies having a high frequency stage, such as welders, plasma cutters, or induction heaters, are more likely to create high frequency noise that limits the usefulness of such ground fault protection devices.

A second type of prior art ground fault protection circuit in common use is shown in FIG. 12. One end of the primary winding 903 of a transformer 901 is connected to a floating output 902 of the power supply 900. The other end of primary winding 903 is connected to ground. One end of the secondary winding 904 of transformer 901 is connected to a voltage source 905. The other end of secondary winding 904 is connected to one end of a relay coil 906. The other end of relay coil 906 is connected back to voltage source 905 to complete a detection circuit. A mechanical push button reset 907 is also typically included in the circuit.

Absent a ground fault, there is no complete circuit path to ground. In the event of a ground fault between floating power supply output 902 and ground, however, a path to ground is formed and current will flow in primary winding 903. The current flowing in secondary winding 904 increases as well. If the increase is large enough, a relay will be tripped and the power supply will shut down. Relay coil 906 has an appropriate trip threshold. The normally open contacts 908 across secondary winding 904 are also closed which shorts out secondary winding 904. This latches the relay and power supply 900 remains shut down until reset 909 is triggered. This prior art circuit uses relays which typically require a current of 20 to 100 mA or more on the primary side to trip relay coil 906.

Accordingly, it is desirable to have a welding, plasma cutting, and/or induction heating power supply with a ground fault protection circuit that has a low current threshold but is not adversely susceptible to the high frequency noise typically generated by welding, plasma cutting, and induction heating power supplies.

The present invention relates generally to an apparatus and method for detecting a ground fault. More specifically, it relates to an apparatus and method for detecting a ground fault while providing welding, plasma cutting, and/or induction heating power.

SUMMARY OF THE PRESENT INVENTION

According to a first aspect of the invention, a welding/plasma/induction heating power supply having a ground fault interrupt circuit includes a power supply, a transformer, an impedance, and a comparator. The power supply has a floating output. The transformer includes a first winding in electrical communication between the floating output and a ground. The transformer also includes a second winding in electrical communication with a voltage source. The impedance is in electrical communication with the voltage source such that the impedance in combination with the second winding form a voltage divider. The comparator is connected to receive a sense signal responsive to a voltage across the impedance. The comparator provides an interrupt signal indicative of the existence of a ground fault when the sense signal crosses a threshold.

According to a second aspect of the invention, a method of supplying welding/plasma/induction heating power, including sensing for a ground fault includes providing a floating welding/plasma/induction heating output, dividing a voltage from a voltage source between a first transformer winding and an impedance, wherein a sensed voltage across the impedance is responsive to a leakage impedance across the floating welding/plasma/induction heating output to a ground, comparing a sensed signal responsive to the sensed voltage to a threshold, and providing an interrupt signal indicative of the existence of a ground fault when the sensed signal crosses the threshold.

According to a third aspect of the invention, a welding/plasma/induction heating power supply having a ground fault interrupt circuit includes a power supply, a first transformer, a second transformer, and a detection stage. The power supply includes a floating output. The first transformer has a first winding in electrical communication with the floating output and a second winding in electrical communication with a voltage source. The second transformer is in electrical communication with the voltage source such that the second transformer in combination with the second winding form a voltage divider. The detection stage is connected to receive a sense signal responsive to the voltage across the second transformer. The detection stage provides an interrupt signal indicative of the existence of a ground fault when the sense signal crosses a threshold level.

In one embodiment, the welding/plasma/induction heating power supply also includes a filter in electrical communication with the impedance for filtering out high frequency signals and noise.

In a second embodiment, the threshold is responsive to the voltage source. In an alternative embodiment, the threshold is responsive to a utility line input signal to the power supply. In yet another embodiment, the voltage source is responsive to a utility line input signal to the power supply.

In another embodiment, the impedance is a transformer winding. In alternative embodiments, the impedance is a capacitor or an inductor.

In yet another embodiment, substantially no current flows through the impedance in the absence of a ground fault.

In another embodiment, the method includes dividing the voltage between the first transformer winding and a second transformer winding, wherein the sensed voltage is across the second transformer winding.

In alternative embodiments, the method includes dividing the voltage between the first transformer winding and either a capacitor or an inductor, wherein the sensed voltage is across the capacitor or the inductor.

Figure 1:
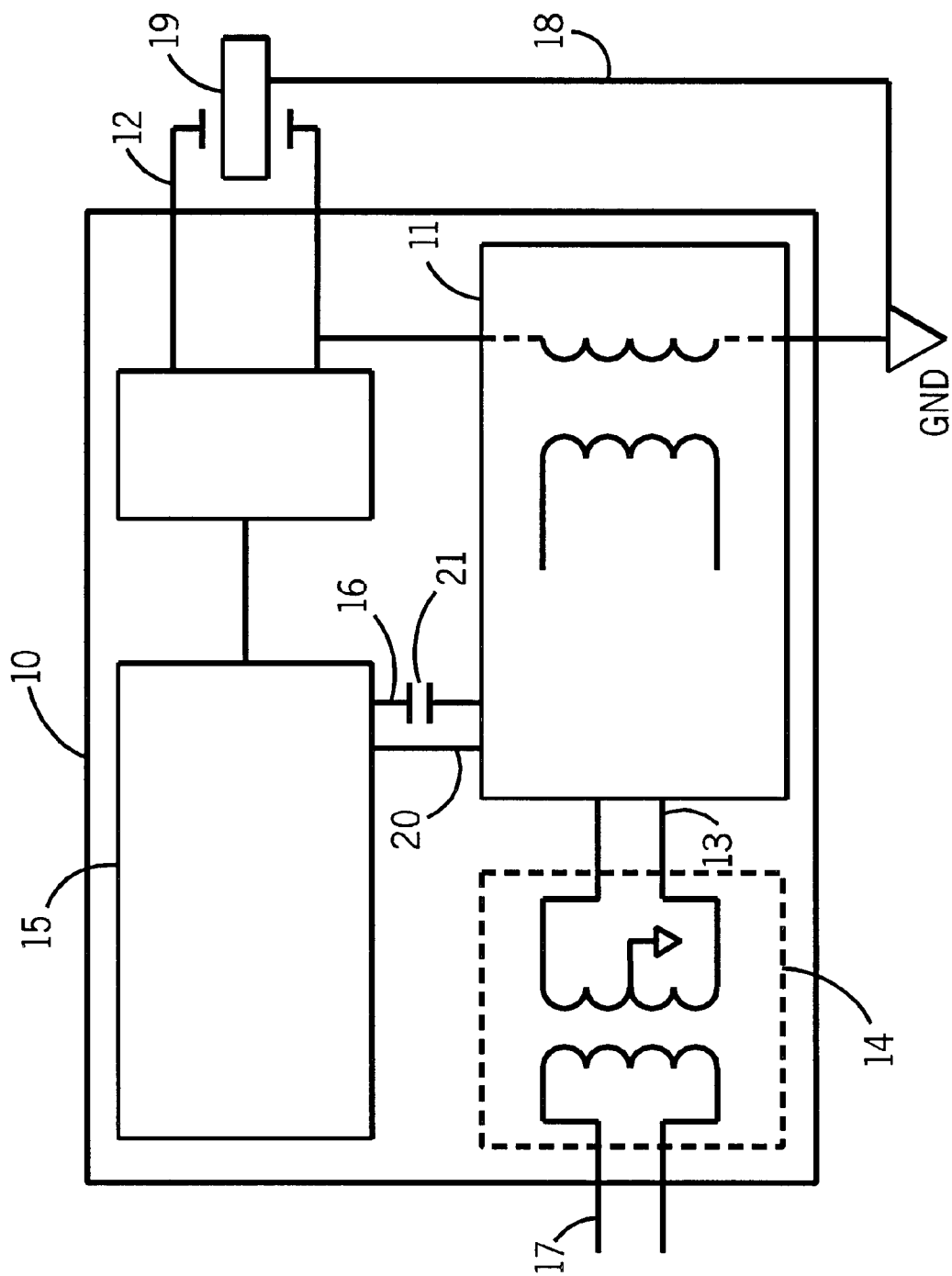
FIG. 1 shows a block diagram of a welding/plasma cutting/induction heating power supply in accordance with the present invention.

Before explaining at least one embodiment of the invention in detail it is to be understood that the invention is not limited in its application to the details of construction and the arrangement of the components set forth in the following description or illustrated in the drawings. The invention is capable of other embodiments or of being practiced or carried out in various ways. Also, it is to be understood that the phraseology and terminology employed herein is for the purpose of description and should not be regarded as limiting. Like reference numerals are used to indicate like components.

DETAILED DESCRIPTION OF THE PREFERRED EMBODIMENTS

While the present invention will be illustrated with reference to a particular ground fault interrupt (GFI) protection circuit and power supply, it should be understood at the outset that the invention may be implemented with other GFI protection circuit configurations and other power supplies. Furthermore, although specific system components, including power supply components and circuit board components are described herein, it should also be understood at the outset that the present invention may be implemented with other system and circuit board components. In addition, the invention can be implemented using digital circuitry or a microprocessor.

Generally, the present invention involves a method and apparatus for supplying welding, plasma cutting and/or induction heating power (welding/plasma/induction heating power) using a GFI protection circuit. The primary winding of a monitoring transformer in the GFI protection circuit is connected between the floating output of the power supply and ground. The floating output is high frequency in the preferred embodiment, for example 10 KHz–50 KHz when implemented with the Miller Intellifire 250, and may typically be dc or 50–400 or more Hz when implemented with a welding or plasma power supply. One end of the secondary of the monitoring transformer is connected to a 60 Hz voltage source. The other end of the secondary is connected to an impedance. The other end of the impedance is connected back to the voltage source to form a voltage divider across the voltage source.

In one embodiment of the present invention, the impedance is a second transformer. In alternative embodiments, the impedance is, singly or in combination, a capacitor, an inductor, a resistor, or a circuit having an impedance. Impedance as used herein means anything across which a voltage can be developed.

The impedance between the floating output of the transformer and ground is normally very large (e.g. open circuit) when no ground fault is present. This impedance is reduced in the event of a ground fault. Changes in the impedance between the high frequency floating output of the power supply and ground are sensed by the GFI protection circuit and converted into a 60 Hz voltage. This voltage is filtered, rectified, and calibrated into a dc sense signal. The sense signal is compared to a threshold signal. In the event the sense signal exceeds the threshold signal, an interrupt signal is sent to the power supply and the power supply shuts down.

FIG. 1 shows a block diagram of the preferred embodiment of the present invention which includes a power supply 10 and a ground fault interrupt (GFI) protection circuit 11 connected to the floating output 12 of power supply 10. Power supply, as used herein, includes any device capable of supplying welding, plasma cutting, and/or induction heating power including resonant power supplies, quasi-resonant power supplies, etc. The commercially available Miller Intellifire 250, described in U.S. patent application Ser. No.

08/893,354, entitled METHOD AND APPARATUS FOR PRODUCING POWER FOR AN INDUCTION HEATER, filed Jul. 16, 1997, commonly owned by the assignee of this application and incorporated herein by reference, is a power supply suitable for supplying induction heating power.

GFI protection circuit 11 of the preferred embodiment uses a 36 volts rms, 60 Hz, unregulated control signal 13 available from power supply 10 for its operation. Control signal 13 is obtained by stepping down the line voltage 17 input into power supply 10 via a center tapped control transformer 14. The secondary winding of control transformer 14 is center tapped such that control signal 13 in the preferred embodiment is actually 18 volts rms relative to ground. The positive half of control signal 13 (e.g. +18 volts) is used by GFI protection circuit 11 to monitor the overall system for ground faults.

GFI protection circuit 11 sends an interrupt signal 20 to a control board 15 in power supply 10 instructing power supply 10 to electrically shut down in the event that a ground fault is detected. Additionally, in the preferred embodiment, a redundant set of relay contacts 21 in series with the main 24 volt control signal 16 of power supply 10 are opened thus disabling the controller. A backup system is therefore provided to shut down power supply 10 in the event that a ground fault occurs.

A grounding strap 18 is connected between the workpiece 19 and ground in one embodiment of the present invention. Grounding strap 18 provides an alternative path to ground for the ground fault current to flow in the event that a ground fault occurs.

Figure 2:
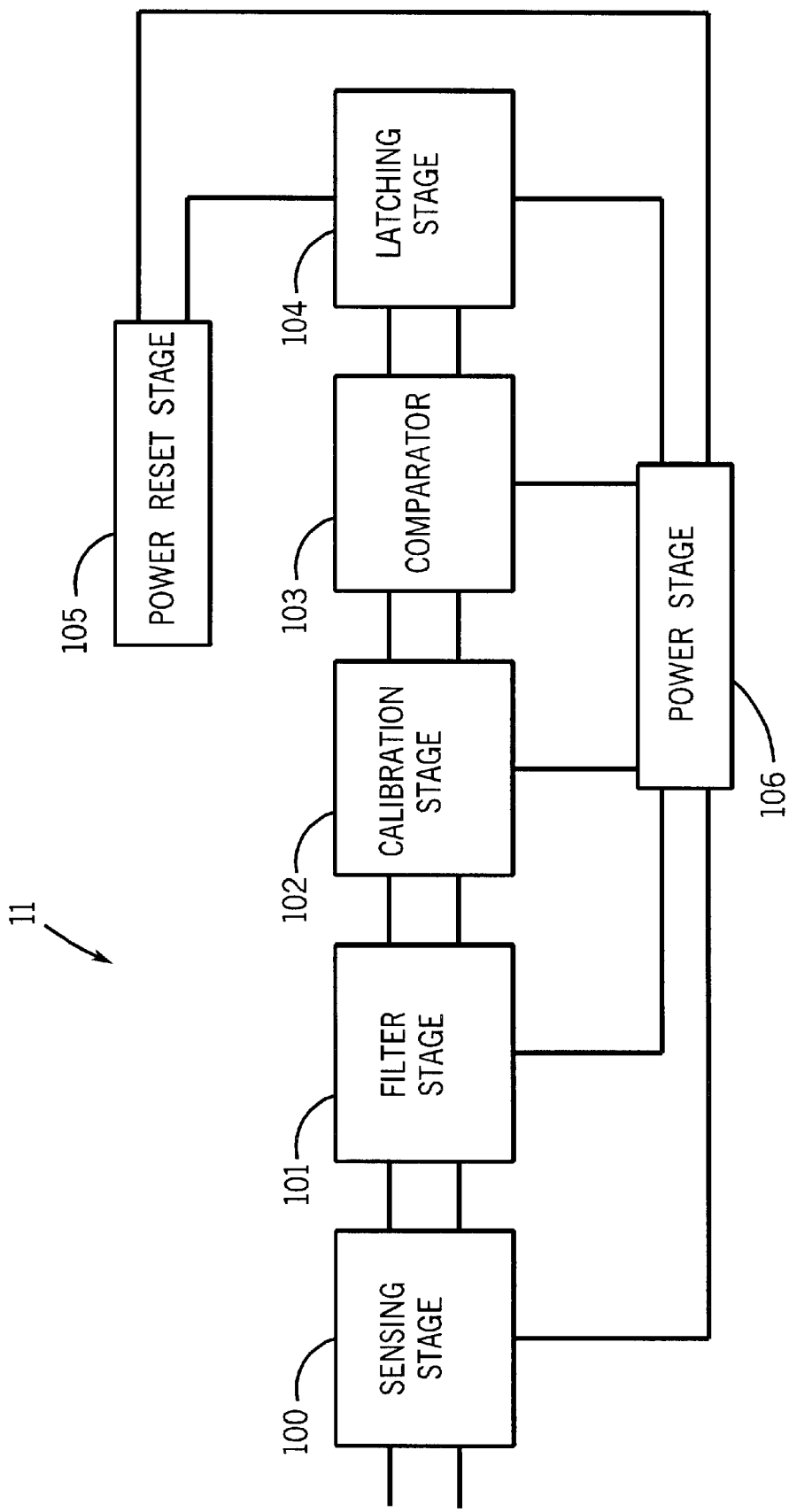
FIG. 2 shows a block diagram of a ground fault interrupt protection circuit in accordance with the present invention.
Figure 3A:
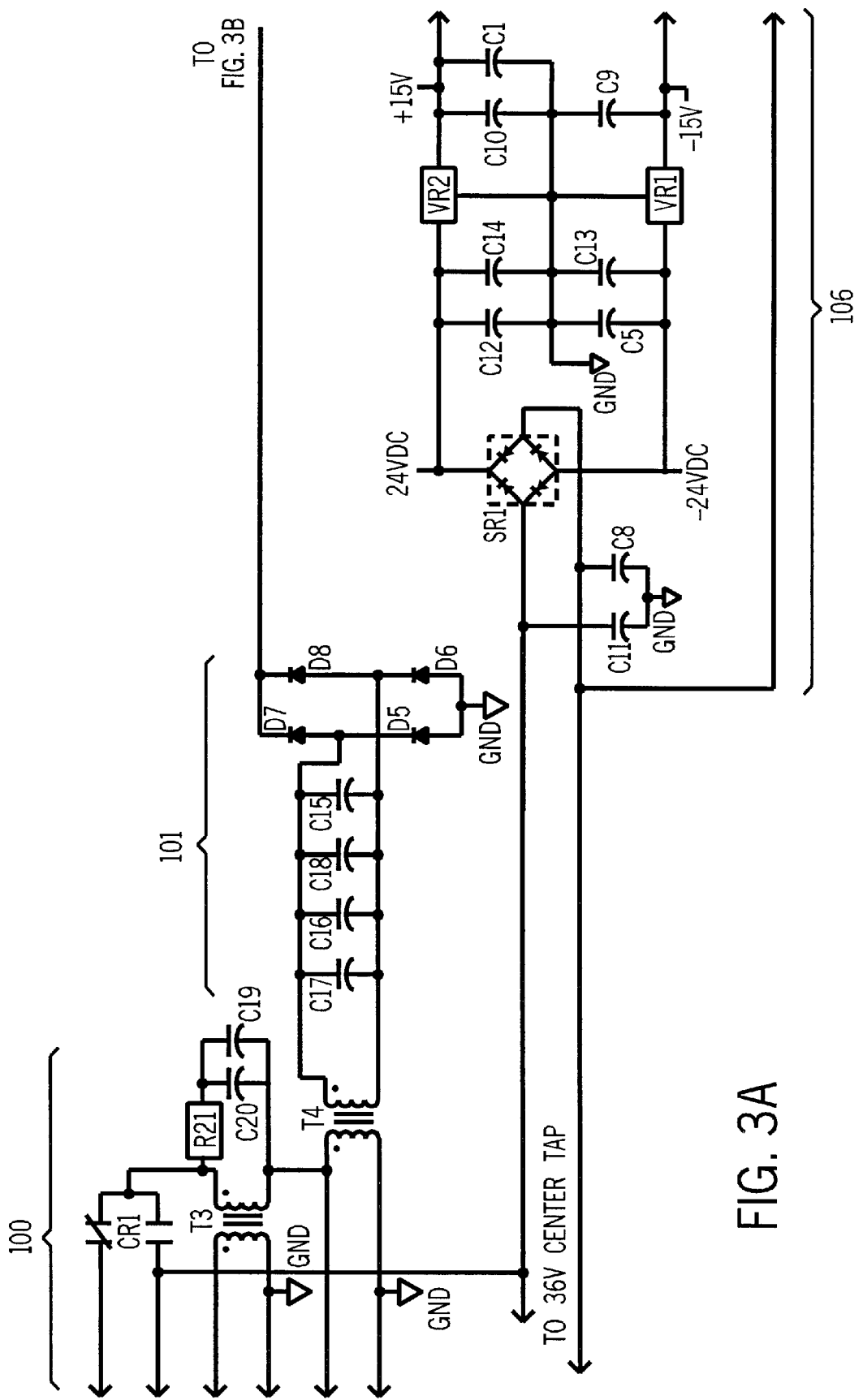
FIGS. 3A–B show a schematic diagram of a ground fault protection circuit in accordance with the present invention.
Figure 3B:
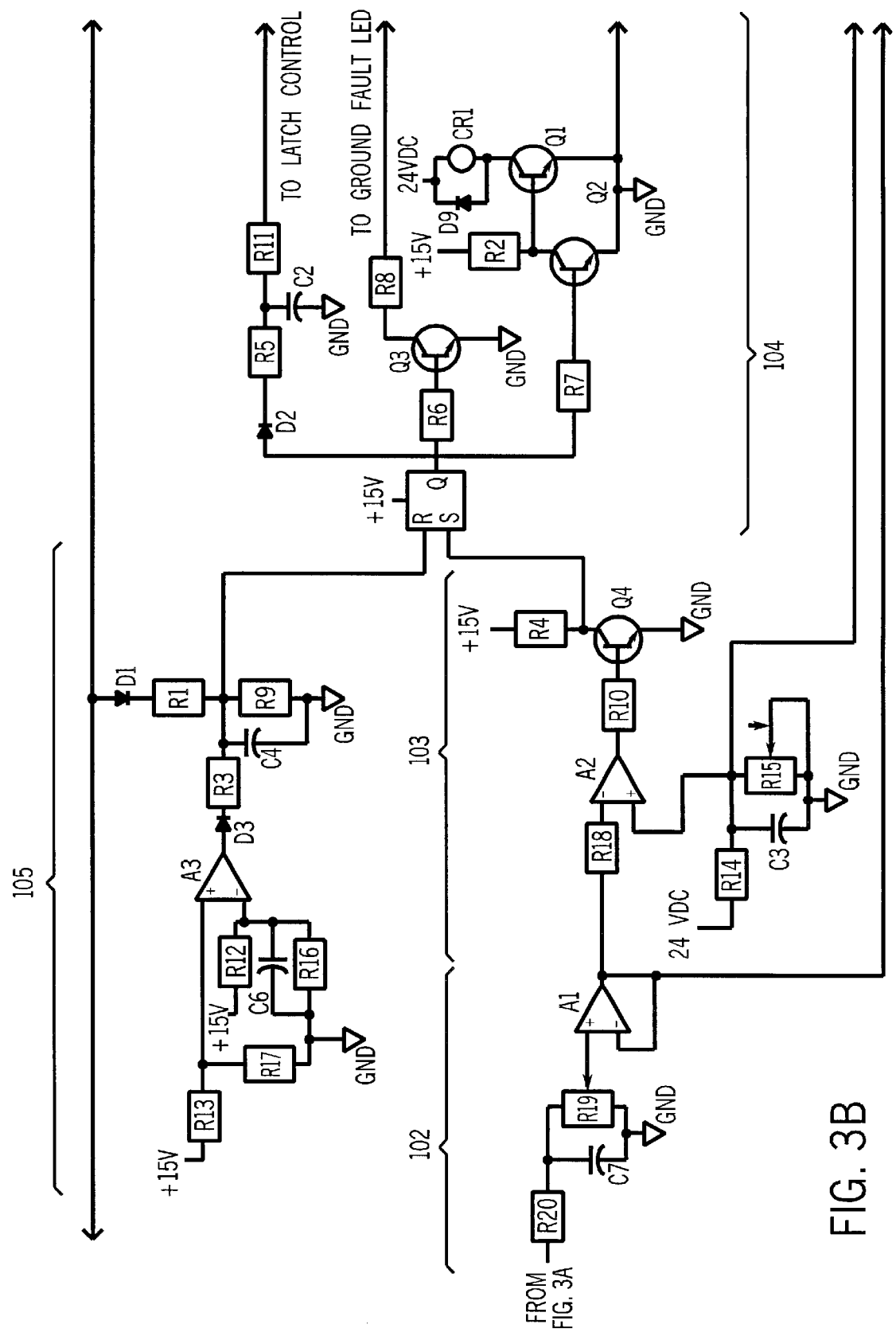

FIG. 2 shows a block diagram of GFI protection circuit 11 according to the preferred embodiment of the present invention. Ground fault protection circuit 11 includes a sensing stage 100, a filter stage 101, a calibration stage 102, a comparator 103, a latching stage 104, a power reset stage 105, and a power stage 106. According to the present invention, a detection circuit can comprise one or more of sensing stage 100, filter stage 101, calibration stage 102, comparator 103, latching stage 104, power reset stage 105, and/or power stage 106.

Figure 10:
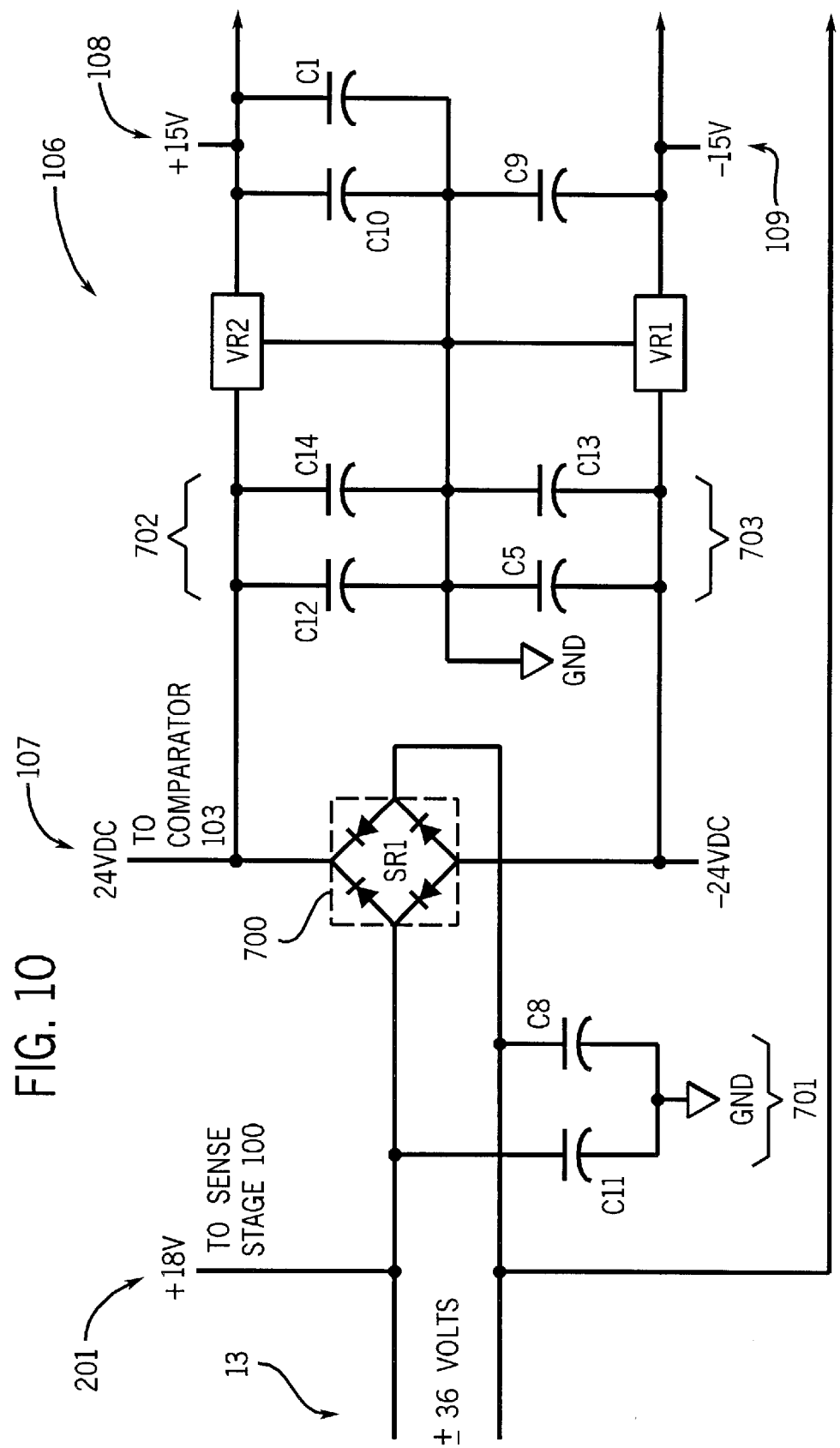
FIG. 10 shows a schematic diagram of the power stage of the ground fault protection circuit shown in FIGS. 3A–B in accordance with the present invention.
Figure 11:
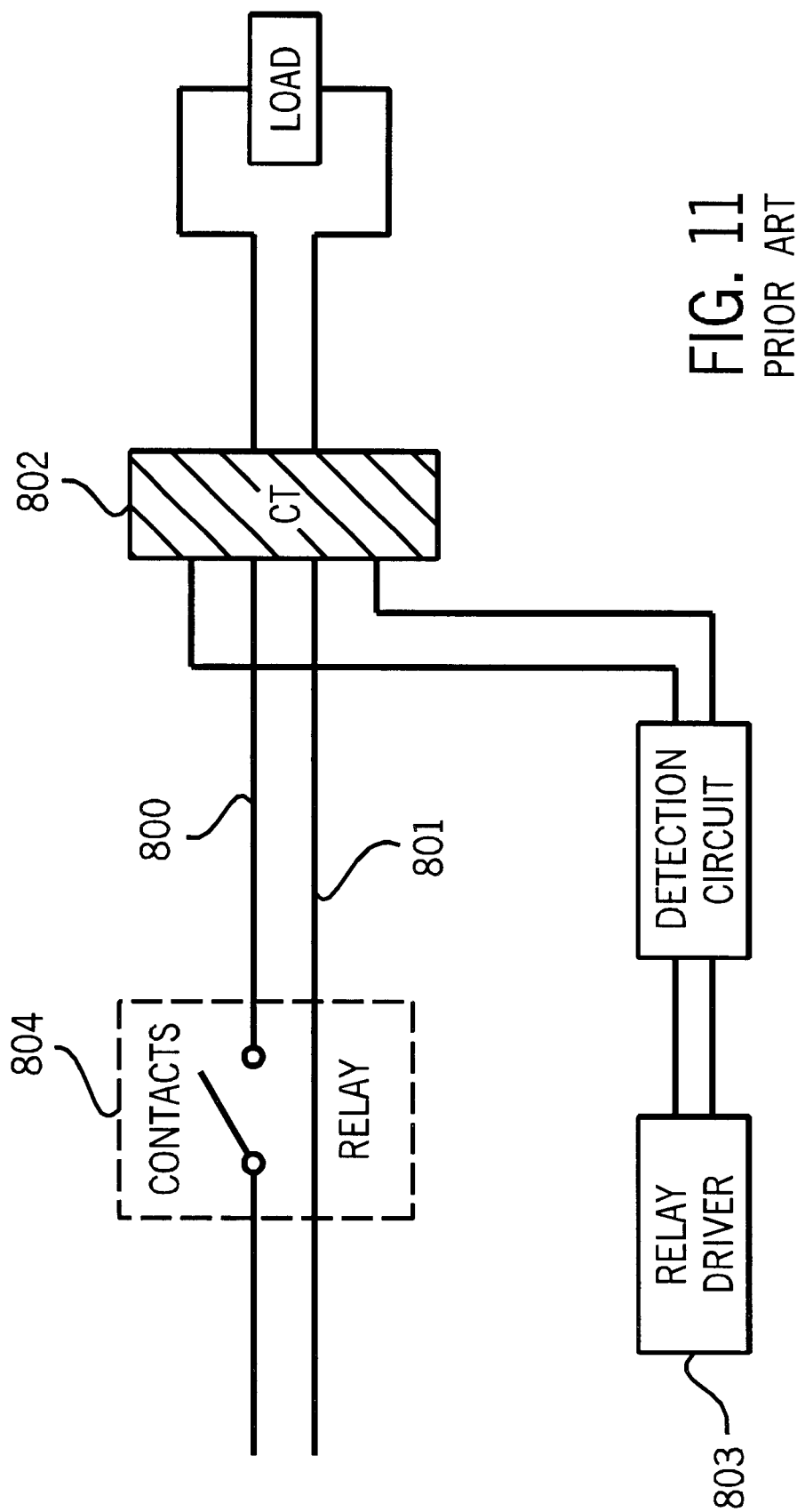
FIG. 11 shows a prior art ground fault protection circuit.
Figure 12:
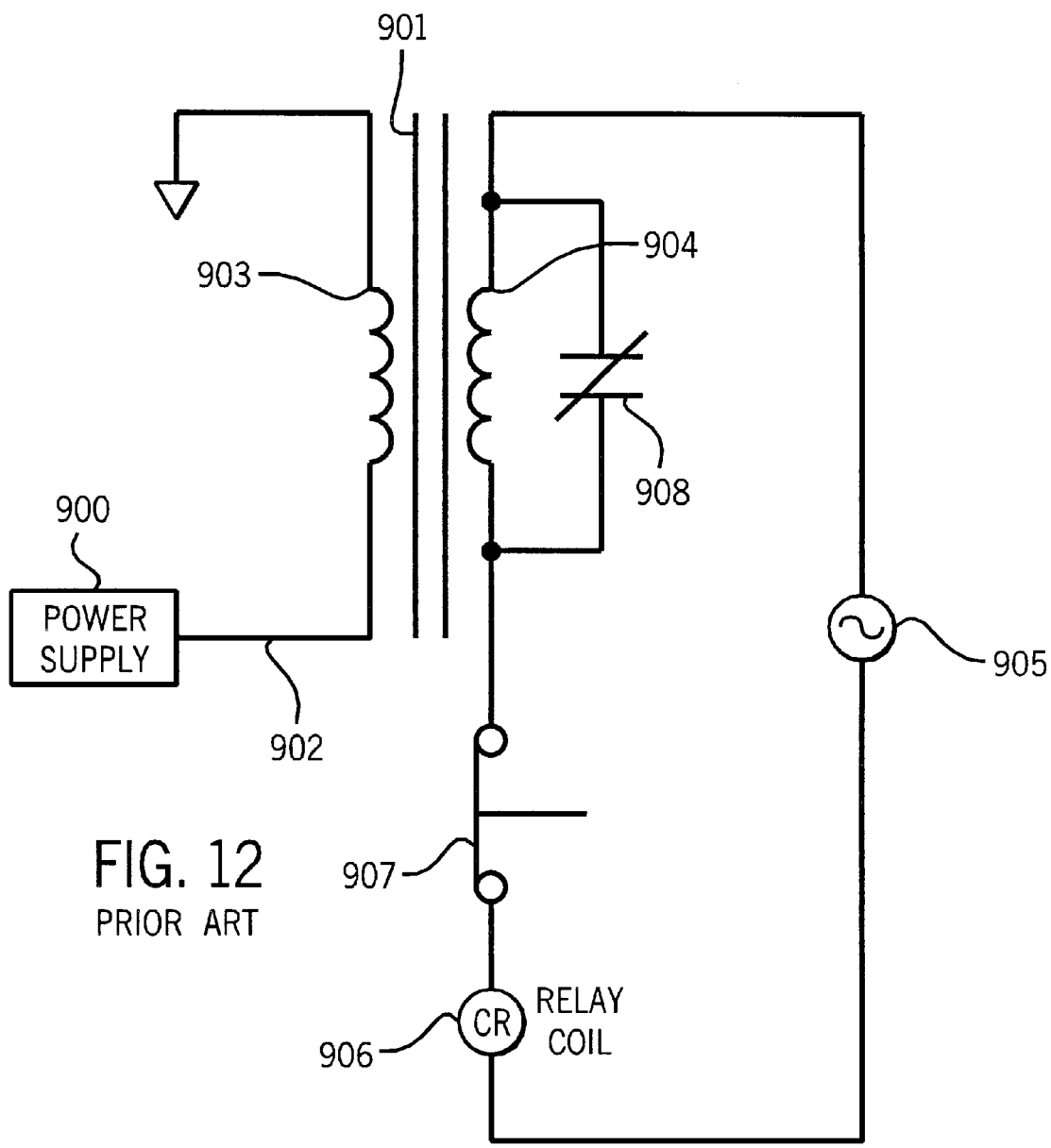
FIG. 12 shows a prior art ground fault protection circuit.

Power stage 106 provides the various voltage signals used in GFI protection circuit 11. Power stage 106 receives 36 volt control signal 13 (actually +/−18 volts) as an input from power supply 10 (see FIG. 10). The unregulated +18 volt portion of control signal 13 is provided by power stage 106 to sensing stage 100 where it is used for monitoring the presence of a ground fault. Control signal 13 is also provided to a full wave rectifier in power stage 106. The useful output of the full wave rectifier is an unregulated 24 volt dc threshold control signal 107 (see FIG. 10). Threshold control signal 107 is supplied to comparator 103 and to latching stage 104. It is used to set the threshold voltage level for comparison purposes in comparator 103 and is used to drive the relay coil in latching stage 104 as will be explained in more detail herein.

In addition to threshold control signal 107, power stage 106 provides +15 volt and −15 volt regulated dc bias voltages 108, 109. These regulated voltages are supplied to calibration stage 102, comparator 103, latching stage 104, and power reset stage 105 for powering many of the components in GFI protection circuit 11.

The input of sensing stage 100 is connected between high frequency floating output 12 and ground in the preferred embodiment. The impedance across floating output 12 to ground is normally very high (e.g. approaching an open circuit) in the absence of a ground fault. When a ground fault occurs, a leakage impedance will generally be present across floating output 12 to ground. The leakage impedance allows the ground fault current to flow to ground. Sensing stage 100 generally senses this leakage impedance and converts it into a voltage at its output.

Leakage impedance, as used herein, includes any impedance between the floating output of the power supply and ground that provides a current path to ground through which a ground fault current can flow.

The output voltage of sensing stage 100 generally increases in the preferred embodiment as the leakage impedance decreases (e.g. the ground fault current increases). In this way, sensing stage 100 is an impedance to voltage convertor converting the leakage impedance at its input into a voltage at its output. As an impedance to voltage convertor, one advantage to the preferred embodiment of the present invention is that power supply 10 does not need to be on for GFI protection circuit 11 to detect a ground fault. In other words, GFI protection circuit 11 can detect a ground fault before any power is supplied to floating output 12.

Although the output voltage increases with a decrease in leakage impedance in the preferred embodiment, the present invention is not limited to circuits having this relationship. In an alternative embodiment, the output voltage of sensing stage 100 decreases as the leakage impedance decreases.

The output of sensing stage 100 is provided to filter stage 101. Filter stage 101 filters out any high frequency signals that happen to leak into GFI protection circuit 11 through sensing stage 100 from power supply 10. This leaves a relatively clean 60 Hz signal at the output of filter stage 101. The filtered signal is provided to a full wave rectifier where the signal is rectified into a dc output signal. This rectified dc output signal is then provided to calibration stage 102. Thus, GFI protection circuit 11 is well suited to use with power provided at higher frequencies than utility (100 Hz or more, e.g.)

Generally, each of the active components in GFI protection circuit 11 are powered by +/−15 volt dc rails 108, 109. The input to each of these components, as a result, is generally limited to the range between +/−15 volts. It is desirable therefore to calibrate the output signal received from filter stage 101 to insure that the sense signal provided to comparator 103 is in this acceptable range.

The calibration is carried out as follows. The maximum voltage available from filter stage 101 occurs in the preferred embodiment when the leakage impedance is a short circuit (e.g. minimum leakage impedance). A short is placed across floating output 12 to ground and the output of calibration stage 102 is adjusted so that the maximum output voltage from this stage is between 10 and 12 volts dc. The calibrated voltage is then buffered and provided to comparator 103 for comparison to a threshold voltage.

Comparator 103 receives the calibrated output sense voltage from calibration stage 102 and compares it to a threshold voltage. In the preferred embodiment, the sense voltage received from calibration stage 102 is responsive to the output voltage of sensing stage 100 and increases as the leakage impedance decreases. With no ground fault present, the input voltage to comparator 103 is approximately 5 volts peak in the preferred embodiment. The threshold voltage is set above this level, at approximately 6 volts peak, in the preferred embodiment.

During normal operation of power supply 10, the output of comparator 103 will remain in a low state as long as the sense voltage input to comparator 103 is below the threshold voltage. If a ground fault occurs, however, the sense voltage input to comparator 103 (which is also responsive to the output voltage of sensing stage 100) will rise and cross the threshold voltage of 6 volts. At this point, the output from comparator 103 switches to a high state.

As used herein, a first signal is responsive to a second signal when the first signal is a function of the second signal. Also as used herein, comparator means a device that electrically compares a first signal with a second signal and provides an output that has a first value (or range of values) when the first signal is less than or equal to the second signal and a second value (or range of values) different from the first value (or range of values) when the first signal is greater than the second signal including op amp circuits, transistor circuits, analog and digital circuits, etc.

The output of comparator 103 is received by latching stage 104. As long as the output signal from comparator 103 remains in a low state, no interrupt signal is generated. However, soon after a ground fault occurs, the input signal from comparator 103 to latching stage 104 switches to a high state. An interrupt signal is generated at the output of latching stage 104 and several events are triggered.

First, the interrupt signal is sent from latching stage 104 to the power supply's control board 15 to immediately and electronically shut down power supply 10. Second, an LED indicator on the front of power supply 10 is lit to indicate that a ground fault has been detected and that power supply 10 has been shut down. Third, the relay contacts placed in series with 24 volt control signal 16 of power supply 10 are opened redundantly and electro mechanically shutting down power supply 10. Finally, a second pair of contacts inside of sensing stage 100 are opened to prevent the +18 volt 60 Hz monitoring signal available at the input of sensing stage 100 from reaching the floating output of the power supply during a ground fault situation.

GFI protection circuit 11 is reset by turning power supply 10 off and then back on. Power reset stage 105 automatically provides a reset signal to latching stage 104. The reset signal resets the latch contained in latching stage 104 and GFI protection circuit 11 is automatically reset.

Referring now to the schematic diagrams shown in FIGS. 3A–B and FIGS. 4–10, a more detailed analysis of GFI protection circuit 11 will be provided. Power stage 106 shown in FIG. 10 includes a rectifier 700, filters 701, 702, and 703, voltage regulators VR1 and VR2, and three 0.1 microfarad capacitors C9, C10, and C1. Control signal 13 is provided to power stage 106 from power supply 10. Voltage source 201 is tapped off of control signal 13 and provided to sense stage 100. Control signal 13 is then provided through filter 701 to full wave rectifier 700.

Filter 701 comprises two 0.1 microfarad capacitors C8 and C11. Filter 701 filters out any noise that may be present at that point in the circuit. The outputs from full wave rectifier 701 are +/−24 volt dc signals. The +24 volt dc signal is threshold control signal 107 provided to comparator 103.

Following rectifier 700, each of the two 24 volt dc signals are filtered by filters 702 and 703 respectively. Filter 702 comprises capacitors C12 (2200 microfarads) and C14 (0.1 microfarad) connected to ground and smooths out the +24 volt dc signal. Likewise, filter 703 comprises capacitors C5 (2200 microfarads) and C13 (0.1 microfarad) connected to ground and smooths out the −24 volt dc signal.

Each of the smoothed 24 volt dc signals is then provided to a voltage regulator VR2 and VR1. The outputs from VR2 and VR1 are the two +/−15 volt regulated biasing voltages 108, 109 that are used throughout GFI protection circuit 11 for powering various devices. Finally, three 0.1 microfarad capacitors C1, C9 and C10 are provided to eliminate any noise that may be present at that point in the circuit as well.

Figure 4:
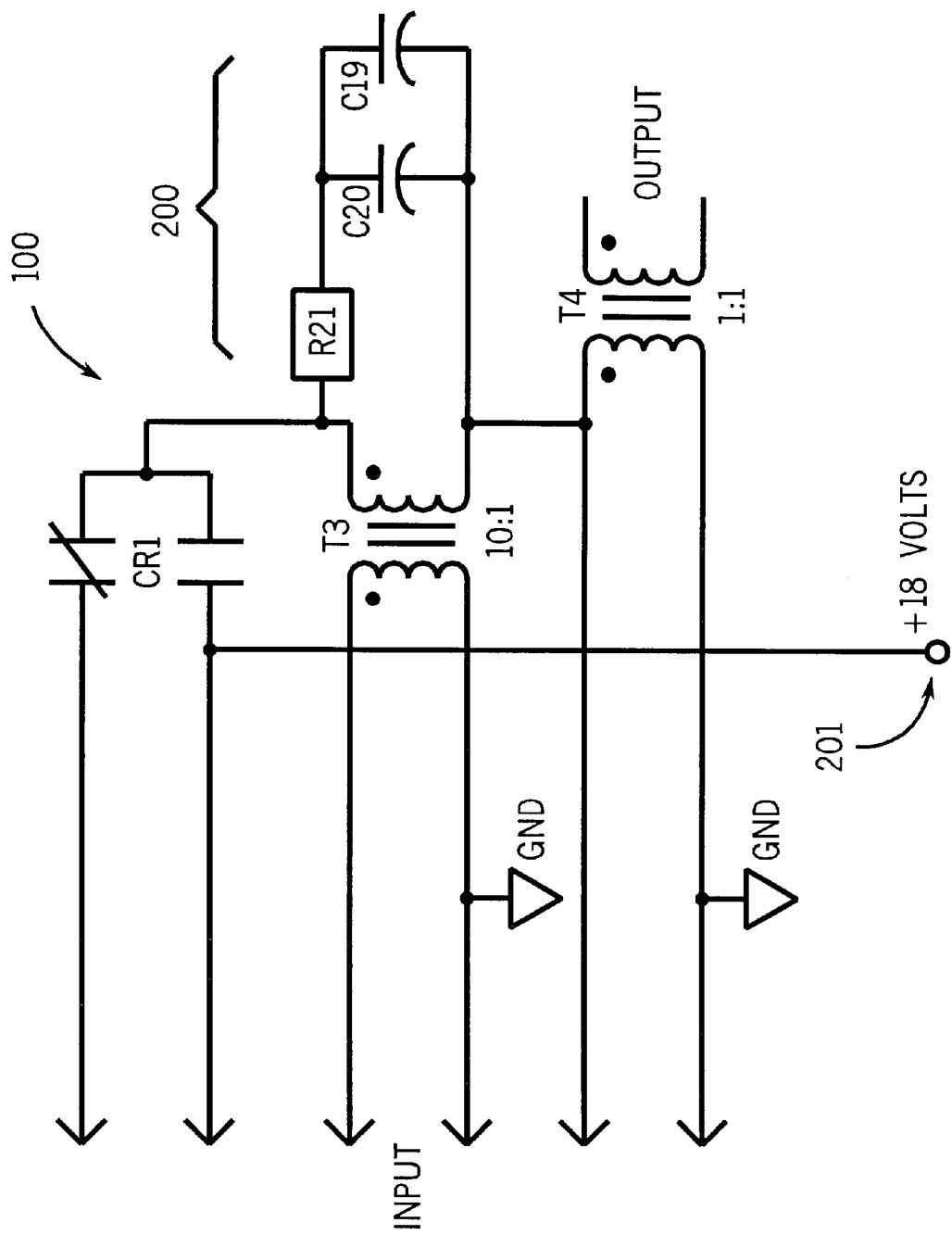
FIG. 4 shows a schematic diagram of the sensing stage of the ground fault protection circuit shown in FIGS. 3A–B in accordance with the present invention.

Sensing stage 100 shown in FIG. 4 includes two transformers T3 and T4, and a high frequency filter 200 connected across the secondary winding of T4 in the preferred embodiment. T3 is a monitoring transformer with a 10:1 turns ratio. T4 is an isolation transformer having a turns ratio of 1:1. Filter 200 includes a 100 ohm resistor R21 connected in series with the combination of two one microfarad capacitors C19 and C20. Filter 200, which is connected across T3, filters out high frequency signals and spurious noise that are generated by power supply 10 and received across T3.

The primary winding of T3 is normally connected between floating output 12 of power supply 10 and ground. One end of the secondary winding of T3 is connected to a 18 volt, 60 Hz, unregulated voltage source 201 through normally open relay contacts CR1. The other end of the secondary winding of T3 is connected to one end of the primary winding of T4, the other end of which is connected to ground to complete the circuit. Relay contacts CR1 close when power supply 10 first turns on and remain closed during normal operation. Voltage source 201 is obtained from power stage 106 as previously described.

With T3 being a 10:1 transformer, the impedance reflected from the primary side to the secondary side of T3 is stepped down by a factor of 100 in the preferred embodiment. Nonetheless, the impedance seen by the primary winding of T3 looking back into the floating output of the power supply to ground normally is very high (e.g. close to an open circuit). The impedance that appears on the secondary side, as a result, is very high also (even with the step down) when no ground fault exists. During normal operation, therefore, substantially no current flows through the primary winding of T4 or the secondary of T3.

The secondary winding of T3 in combination with the primary winding of T4 form a voltage divider across voltage source 201. During normal operation of power supply 10, the voltage of voltage source 201 is divided such that roughly eighty percent of the voltage appears across the secondary of T3 with the remaining twenty percent appearing across the primary of T4 in the preferred embodiment. It should be noted that the invention is not limited to this particular voltage divider ratio and any ratio that allows for the detection of a ground fault can be used. T4 in the preferred embodiment is a 1:1 transformer and so the divided voltage appearing on the primary side of T4 is transformed to the secondary side for input into filtering stage 101.

If there is a ground fault, a leakage impedance is between floating output 12 and ground, which is less than the impedance normally appearing across the primary of T3. The lesser impedance appears across the secondary of T3, reduced by a factor of 100.

Because the impedance across the secondary of T3 is reduced, and the impedance across the primary of T4 fixed, voltage from voltage source 201 shifts from the secondary of T3 to the primary of T4. Likewise, the voltage across the secondary of T4 also increases. In other words, as the impedance across the primary of T3 decreases, the voltage across the secondary of T4 increases. The voltage across the secondary winding of T4 (the output of sensing stage 100) is provided to filter stage 101.

Figure 5:
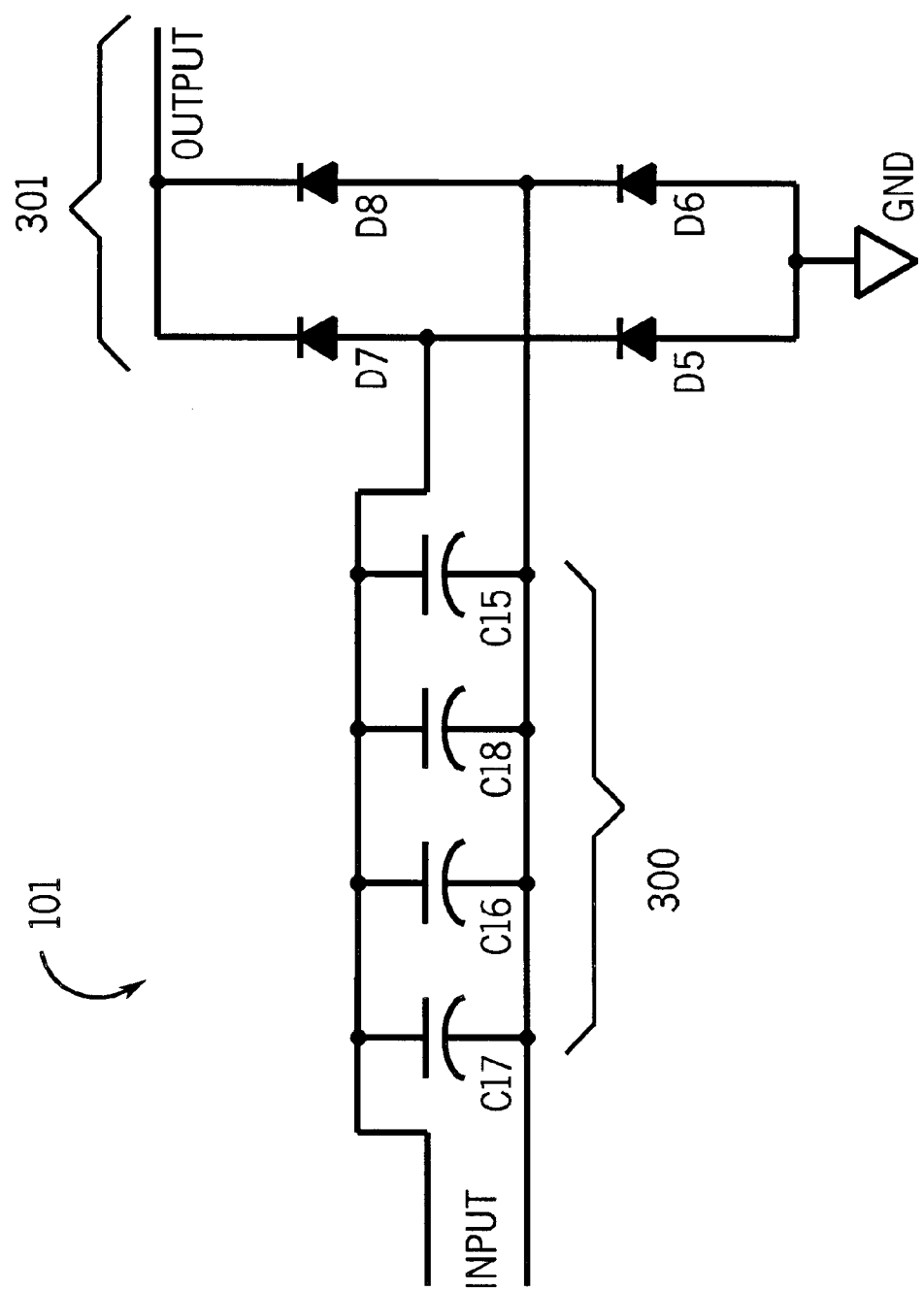
FIG. 5 shows a schematic diagram of the filter stage of the ground fault protection circuit shown in FIGS. 3A–B in accordance with the present invention.

Filter stage 101 as shown in FIG. 5 includes a high frequency filter 300 and a full wave rectifier 301. High frequency filter 300 is comprised of four one microfarad capacitors C17, C16, C18, C15 each of which are connected in parallel across the input of filter stage 101 (and therefore across the secondary winding of T4). Filter 300 filters out high frequency signals and spurious noise that are generated by power supply 10 and received across T3. In addition to high frequency filter 300, filter 200 is also provided for filtering out high frequency signals as previously discussed. Although the preferred embodiment is illustrated using particular high frequency filter configurations, the present invention is not limited to this configurations. Any configuration or type of filter capable of filtering out unwanted high frequency signals and/or spurious noise can be used.

The output of filter 300 is provided to full wave rectifier 301 which includes diodes D5, D6, D7, D8. The fully rectified dc output signal from the full wave rectifier is provided as an input to calibration stage 102.

Figure 6:
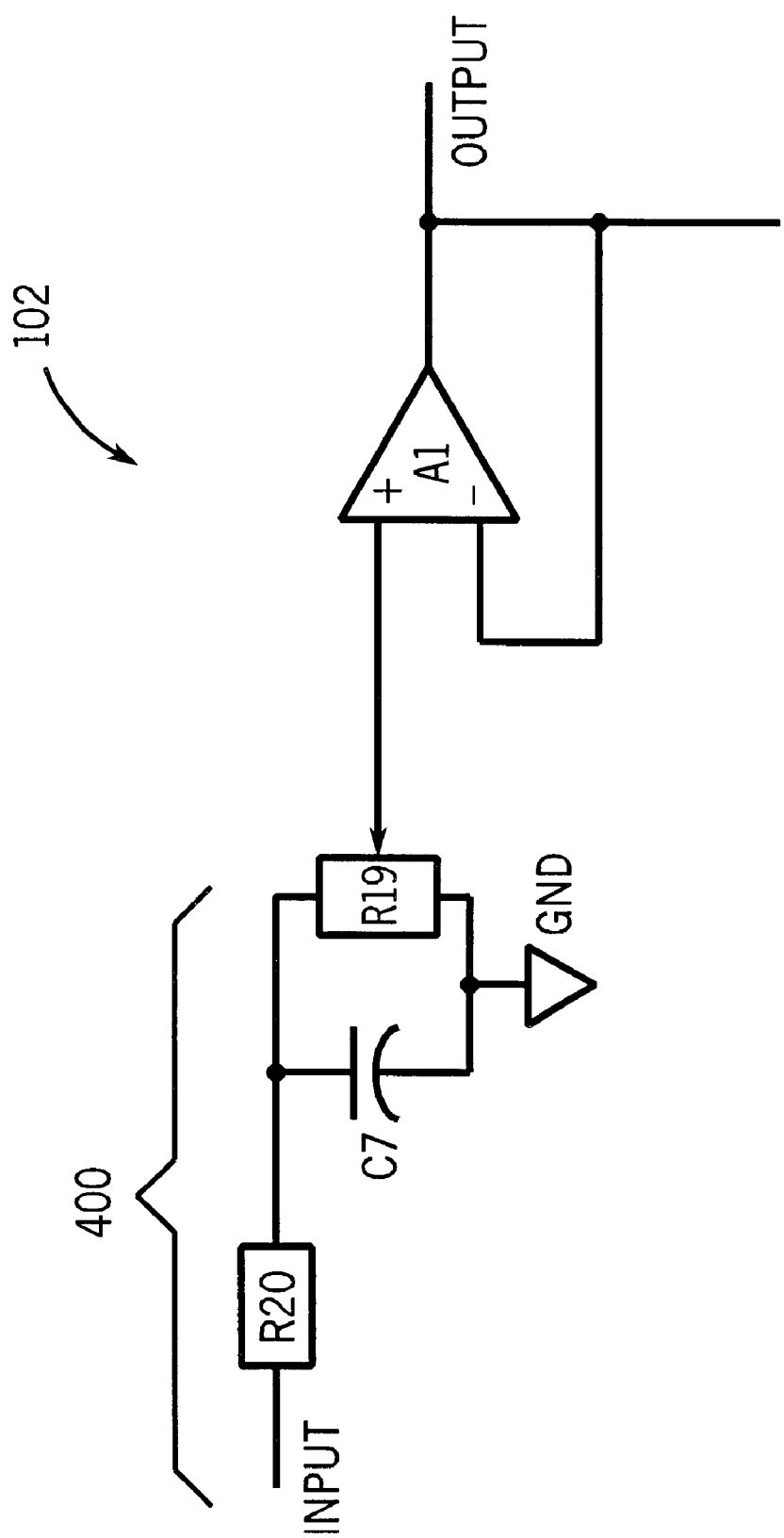
FIG. 6 shows a schematic diagram of the calibration stage of the ground fault protection circuit shown in FIGS. 3A–B in accordance with the present invention.

Calibration stage 102 shown in FIG. 6 comprises an operational amplifier A1 preceded by a resistive voltage divider 400 comprising R20 and R19. Op amp A1 is a unity gain buffer amplifier in this circuit. R20 is a fixed 10 kohm resistor. R19 is a variable 100 kohm resistor. A 0.1 microfarad capacitor C7 is included across R19 in the preferred embodiment to filter out any unwanted noise that may be present at that point in the circuit. In an alternative embodiment, a 10 volt zener diode (with the anode grounded) is also placed across R19 to limit the magnitude of the voltage at op amp A1 to 10 volts.

The voltage appearing at the input to calibration stage 102 with the primary of T3 shorted to ground (e.g. worst case scenario) is approximately 25 volts dc in the preferred embodiment. To prevent damage to op amp A1 and other circuit components downstream from buffer amplifier A1, resistor R19 is adjusted to provide approximately 7 kohms to 9 kohms of resistance in the preferred embodiment. The voltage at the non-inverting input of op amp A1 will then be approximately 10 to 12 volts peak. This establishes the maximum voltage that will be available to the non-inverting input of op amp A1 in the preferred embodiment because the voltage appearing across the secondary of T4 (output of sensing stage 100) is at a maximum when floating output 12 is shorted to ground.

During normal operation of power supply 10 (e.g. no ground fault present), with R19 adjusted to provide approximately 7 kohms to 9 kohms of resistance, the voltage appearing at the non-inverting input to op amp A1 is approximately 5 volts peak in the preferred embodiment. This sense voltage is buffered to the output of op amp A1 and is provided to comparator 103 for comparison with the threshold voltage.

Figure 7:
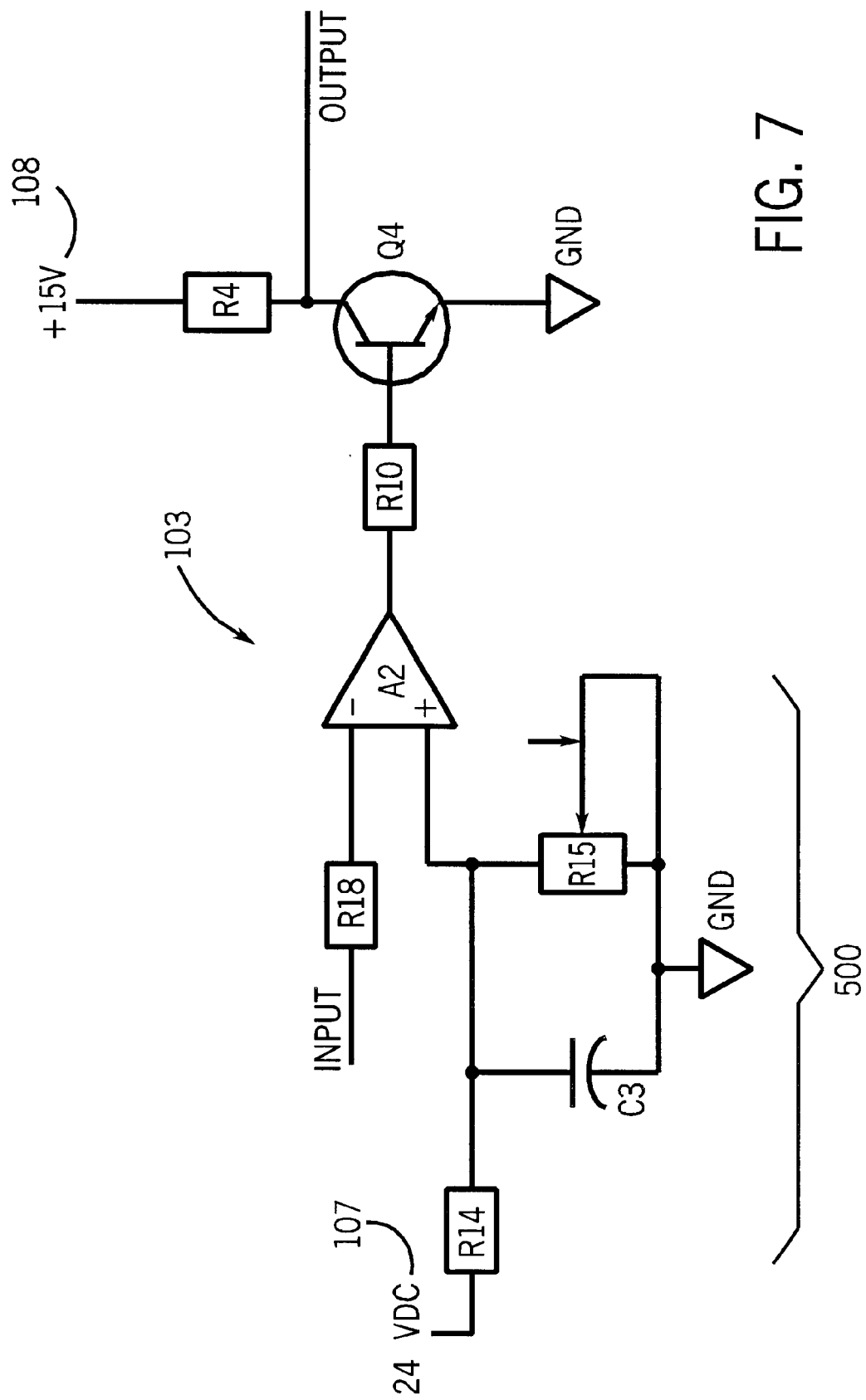
FIG. 7 shows a schematic diagram of the comparator of the ground fault protection circuit shown in FIGS. 3A–B in accordance with the present invention.

Comparator 103 shown in FIG. 7 comprises an op amp A2, a trip threshold sub-circuit 500, a transistor Q4, and resistors R18 (10 kohms), R4 (2.21 kohms), and R10 (10 kohms). Op amp A2 is configured as a comparator. The output from calibration stage 102 is received at the inverting input of op amp A2 through a 10 kohm resistor R18 in series with the inverting input.

Trip threshold sub-circuit 500 comprises 24 volt threshold control signal 107 and a voltage divider including a fixed 10 kohm resistor R14 and a 100 kohm variable resistor R15. A one microfarad capacitor C3 is added across resistor R15 to eliminate any noise that may be present at this point in the circuit. In an alternative embodiment, a 10 volt zener diode (with the anode grounded) is also placed across R15 to limit the magnitude of the voltage at the non-inverting input of op amp A2 to 10 volts.

Threshold control signal 107 is resistively divided across resistors R14 and R15 to provide the desired threshold voltage to the non-inverting input of op amp A2.

Resistor R15 is adjusted to provide approximately 3.33 kohms of resistance in the preferred embodiment which results in a threshold voltage of approximately 6 volts dc. The 6 volt threshold level is chosen in the preferred embodiment because it corresponds to the sense voltage that appears at the input to comparator 103 when a leakage impedance of 200 kohms is connected between floating output 12 and ground. For a 750 volt induction heater, such as the commercially available Intellifire 250, this corresponds to a ground fault current of 3.75 milliamps.

Threshold control signal 107 is an unregulated 24 volt do signal in the preferred embodiment and originates from unregulated 36 volt control signal 13. Voltage source 201 (18 volts), which is applied to T3 and T4 in sense stage 100, also is unregulated and also derives from control signal 13.

The sense voltage appearing at the input to comparator 103 derives from voltage source 201. As a result, any fluctuations in control signal 13 affects both the sense voltage being compared and the threshold that it is being compared to in the same way. In other words, the threshold voltage is a floating threshold and floats with control signal 13 in the same way that the sense voltage floats with control signal 13. Variations in control signal 13, therefore, have no effect on the operation of GFI protection circuit 11.

In normal operation, with the sense voltage from calibration stage 102 (5 volts) below the threshold level (6 volts), the output of op amp A2 is in a high state (approximately +13 volts). If a leakage impedance appears across the primary winding of T3, the sense voltage at the input of op amp A2 increases. If the sense voltage at the inverting input to op amp A2 rises above the 6 volt threshold level (indicating a ground fault is present), the output of op amp A2 switches states to a low state (approximately −13.6 volts).

The output of op amp A2 is provided to the base of transistor Q4. Normally, the high output of op amp A2 biases Q4 on through current limiting resistor R10. When the output of op amp A2 goes low, however, Q4 turns off. With Q4 off, the voltage at the collector of Q4 switches from approximately 0.6 volts to 15 volts. This voltage is provided as the input to latching stage 104.

Figure 8:
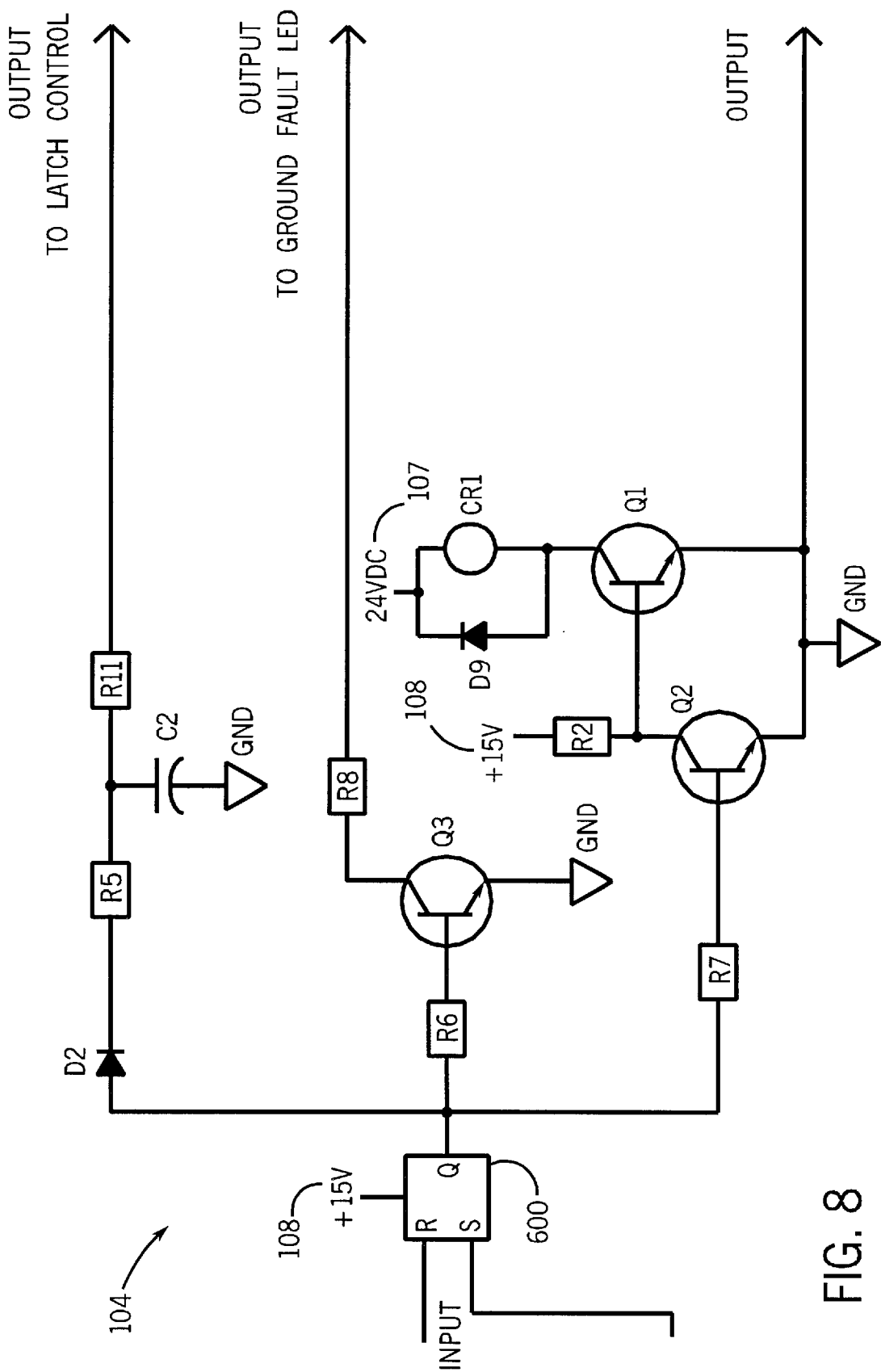
FIG. 8 shows a schematic diagram of the latching stage of the ground fault protection circuit shown in FIGS. 3A–B in accordance with the present invention

Latching stage 104 shown in FIG. 8 includes an RS latch 600, transistors Q1, Q2, and Q3, resistors R2, R5, R6, R7, R8, and R11, capacitor C2, diodes D2 and D9, and the coil for CR1. RS latch 600 has a set pin (pin S), a reset pin (pin R), and an output (pin Q). When the output of comparator 103 switches from low to high, RS latch 600 is set and the output of latch 600 goes from a low state to a high state (e.g. from 0 to 15 volts) in the preferred embodiment. With latch 600 set, a number of events are triggered.

To begin with, a 15 volt interrupt signal from latch 600 (pin Q) is provided through diode D2 to control board 15 in power supply 10. Upon receiving the interrupt signal, control board 15 automatically and electronically shuts down power supply 10. The interrupt signal is provided to control board 15 through a T-filter comprising two 100 ohm resistors R5 and R11 and 0.1 microfarad capacitor C2. This filter is used to filter out noise that may be present from lights or the power supply itself. Unfiltered, this noise can cause nuisance trips to occur.

The interrupt signal from latch 600 also turns on an LED indicator light indicating that a ground fault has been detected. The signal from latch 600 turns on transistor Q3 through current limiting resistor R6 (10 kohms). With Q3 turned on, current flows through the LED from a +15 volt supply (not shown), through pull down resistor R8 (2.21 kohms) and through Q3 to ground.

Finally, the interrupt signal is provided to open relay contacts in sensing stage 100 (see CR1 in FIG. 4) and relay contacts (see FIG. 1) in series with the main control signal 16 of power supply 10. This occurs in the following manner.

Under normal operation, the input signal (from pin Q of latch 600) to the base of Q2 is zero and Q2 is turned off. Q1 is biased on via +15 volt voltage supply 108 through resistor R2 (2.21 kohms). With Q1 on, current flowing through Q1 also passes through the coil of CR1 and closes the associated relay contacts in sensing stage 100 and in power supply 10.

With a fault detected, however, Q2 is turned on by the interrupt signal (+15 volts) through current limiting resistor R7 (10 kohms). Turning Q2 on pulls the voltage at the collector of Q2 from high to low which turns off Q1. With Q1 turned off, the current in the coil of CR1 goes to zero. With zero current flowing through the coil of CR1, the normally open contacts of CR1 located in sensing stage 100 and in power supply 10 are forced opened. Snubber diode D9 is added to bleed off any current that may be present from the coil of CR1 when Q1 is turned off and protects Q1 from the voltage spike that is produced by CR1.

With no current flowing through the coil of CR1, relay contacts CR1 in sensing stage 100 are forced open. These contacts are located in the path between voltage source 201 and the primary of T3. This is important because the voltage impressed across the secondary of T3 by voltage source 201 (18 volts) is stepped up across T3 to the primary side which is connected to floating output 12 of power supply 10. Opening relay contacts CR1 when a ground fault is detected opens the path between voltage source 201 and the secondary of T3 and no voltage appears across floating output 12.

Relay contacts connected in series with main control signal 16 of power supply 10 are also opened when current stops flowing through the coil of CR1. Without main control signal 16 available, no output power is provided by power supply 10 at floating output 12. This provides a redundant mechanism for shutting down power supply 10 when a ground fault is detected.

Figure 9:
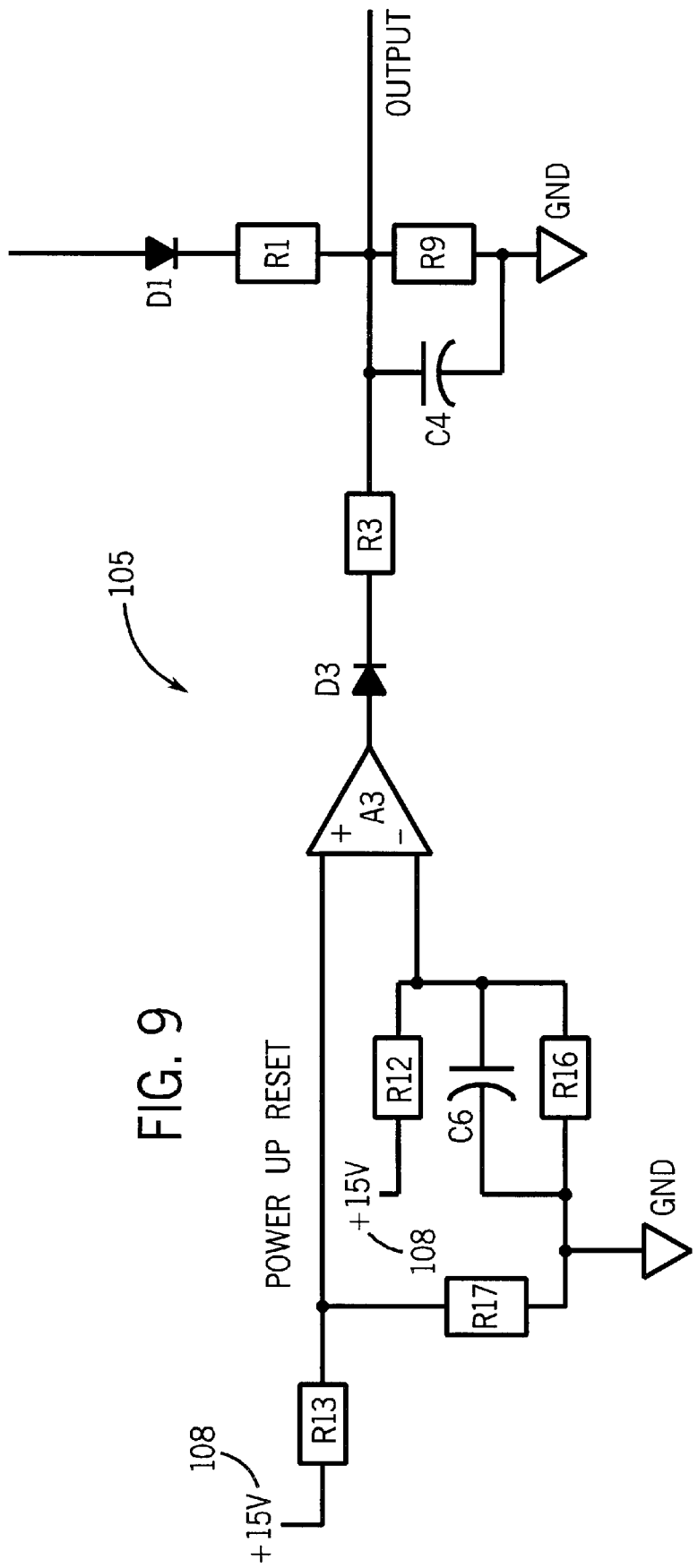
FIG. 9 shows a schematic diagram of the power reset stage of the ground fault protection circuit shown in FIGS. 3A–B in accordance with the present invention.

Power reset stage 105 shown in FIG. 9 resets GFI protection circuit 11 after a ground fault is detected and eliminated. Power reset stage 105 includes an op amp A3, resistors R1, R3, R9, R12, R13, R16, R17, diodes D1 and D3, and capacitors C4 and C6.

The inverting input of op amp A3 is connected to +15 volt dc supply 108 through a voltage divider comprising R13 (10 kohms) and R17 (4.99 kohms). The voltage divider divides +15 volt supply 108 so the voltage at the non-inverting input of op amp A3 is 5 volts. This voltage appears at the input to op amp A3 almost immediately upon re-start of power supply 10.

The inverting input of op amp A3 is connected to +15 volt dc supply 108 through a voltage divider comprising R12 (100 kohms) and R16 (100 kohms). Capacitor C6 (0.1 microfarads) is placed across R16 to slow the rise time of the voltage supplied to the inverting input of op amp A3 upon re-start of power supply 10. It takes approximately 10 milliseconds for this voltage to reach its final value of 7.5 volts in the preferred embodiment.

In operation, the output of op amp A3 is at first high (approximately 13.5 volts) when the voltage at the non-inverting input is greater than the voltage at the inverting input. As the voltage at the inverting input rises, however, it eventually exceeds the voltage at the non-inverting input at which time the output of op amp A3 switches to a low state (approximately 13.0 volts).

The output of op amp A3 is provided to the reset pin (pin R) of latch 600 through diode D3. With the output high, latch 600 is reset. Capacitor C4 (0.01 microfarad) is used to filter out noise that could cause a spurious reset of the latch. Resistor R3 (10 kohms) is provided in line with the output of op amp A3 to damp out any oscillations that may result from capacitor C4 and the internal capacitance of latch 600.

Eventually, the voltage at the inverting input will reach a voltage that exceeds the voltage at the non-inverting input. At that time, the output of op amp A3 will change to a low state which is its normal state during operation of GFI protection circuit 10. GFI protection circuit 10 is then reset and ready to detect another ground fault. Resistor R9 (100 kohms) is provided to bleed off any extra charge that may have built up in the capacitance of latch 600 and in C4 when the output of the op amp goes low.

In an alternative embodiment, D3 is immediately followed by a 10 kohm resistor feeding the base of an npn bipolar transistor. The collector is connected to the output of full wave rectifier 301. The emitter is connected to ground. This transistor is provided to reduce nuisance trips that occur at re-start. These trips can occur if the input to the set pin (pin S) of latch 600 goes high before the reset pin (pin R) of latch 600 goes high. These trips can be prevented, therefore, by reducing the output of rectifier 301 at re-start and holding it there until the output of op amp A3 switches to a low state.

Diode D1 and 10 kohm resistor R1 are included to allow for manual resetting of GFI protection circuit 11. This is accomplished simply by applying +15 volts to the anode side of diode D1. Access to the anode side of D1 is available on an external connector included in power supply 10.

Numerous modifications may be made to the present invention which still fall within the intended scope hereof. Thus, it should be apparent that there has been provided in accordance with the present invention a method and apparatus for safely providing welding, plasma cutting, and induction heating power using a ground fault interrupting circuit apparatus and method. Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

What is claimed is:

1. A welding/plasma/induction heating power supply, including a ground fault interrupt circuit, comprising:

a power supply having a floating output;

a transformer having a first winding in electrical communication between the floating output and a ground and further having a second winding in electrical communication with a voltage source;

an impedance in electrical communication with the voltage source, wherein the impedance in combination with the second winding form a voltage divider; and a comparator connected to receive a sense signal responsive to a voltage across the impedance and to provide an interrupt signal indicative of the existence of a ground fault when the sense signal crosses a threshold.

2. The welding/plasma/induction heating power supply of claim 1 further including a high frequency filter in electrical communication with the impedance.

3. The welding/plasma/induction heating power supply of claim 1 wherein the threshold is responsive to the voltage source.

4. The welding/plasma/induction heating power supply of claim 1 wherein the threshold is responsive to a utility line input signal to the power supply.

5. The welding/plasma/induction heating power supply of claim 1 wherein the voltage source is responsive to a utility line input signal to the power supply.

6. The welding/plasma/induction heating power supply of claim 1 wherein the impedance is a transformer winding.

7. The welding/plasma/induction heating power supply of claim 1 wherein the impedance is a capacitor.

8. The welding/plasma/induction heating power supply of claim 1 wherein the impedance is an inductor.

9. The welding/plasma/induction heating power supply of claim 1 wherein substantially no current flows through the impedance in the absence of a ground fault.

10. A method of supplying welding/plasma/induction heating power, including sensing for a ground fault comprising:

proviting a floating welding/plasma/induction heating output;

dividing a voltage from a voltage source between a first transformer winding and an impedance, wherein a sensed voltage across the impedance is responsive to a leakage impedance across the floating welding/plasma/induction heating output to a ground;

comparing a sensed signal responsive to the sensed voltage to a threshold; and providing an interrupt signal indicative of the existence of a ground fault when the sensed signal crosses the threshold.

11. The method of claim 10 further including filtering out high frequency noise.

12. The method of claim 10 further including changing the threshold in response to the voltage source.

13. The method of claim 10 further including changing the threshold in response to a utility line input signal.

14. The method of claim 10 further including changing the voltage source in response to a utility line input signal.

15. The method of claim 10 wherein dividing the voltage further includes dividing the voltage between the first transformer winding and a winding on a second transformer, wherein the sensed voltage is across the winding on the second transformer.

16. The method of claim 10 wherein dividing the voltage further includes dividing the voltage between the first transformer winding and a capacitor, wherein the sensed voltage is across the capacitor.

17. The method of claim 10 wherein dividing the voltage further includes dividing the voltage between the first transformer winding and an inductor, wherein the sensed voltage is across the inductor.

18. The method of claim 10 further including substantially no current flow through the impedance in the absence of a ground fault.

19. A welding/plasma/induction heating power supply, including a ground fault interrupt circuit comprising:

means for providing a floating welding/plasma/induction heating output;

means for dividing a voltage from a voltage source between a first transformer winding and an impedance, such that a sensed voltage across the impedance is responsive to a leakage impedance across the floating welding/plasma/induction output to a ground;

means for comparing a sense signal responsive to the sensed voltage to a threshold; and means for providing an interrupt signal indicative of the existence of a ground fault when the sense signal crosses the threshold.

20. The welding/plasma/induction heating power supply of claim 19 further including means for filtering out high frequency noise.

21. The welding/plasma/induction heating power supply of claim 19 further including means for making the threshold responsive to the voltage source.

22. The welding/plasma/induction heating power supply of claim 19 further including means for making the threshold responsive to a utility line input signal.

23. The welding/plasma/induction heating power supply of claim 19 further including means for making the voltage source responsive to a utility line input signal.

24. The welding/plasma/induction heating power supply of claim 19 wherein the impedance is a transformer winding.

25. The welding/plasma/induction heating power supply of claim 19 wherein the impedance is a capacitor.

26. The welding/plasma/induction heating power supply of claim 19 wherein the impedance is an inductor.

27. The welding/plasma/induction heating power supply of claim 19 wherein substantially no current flows through the impedance in the absence of a ground fault.

28. A welding/plasma/induction heating power supply, including a ground fault interrupt circuit comprising:

a power supply having a floating output;

a first transformer having a first winding in electrical communication with the floating output and further having a second winding in electrical communication with a voltage source;

a second transformer in electrical communication with the voltage source wherein the second transformer in combination with the second winding form a voltage divider; and a detection stage connected to receive a sense signal responsive to the voltage across the second transformer and to provide an interrupt signal indicative of the existence of a ground fault when the sense signal crosses a threshold level.

* * * * *